(12) United States Patent
Deobald et al.

(10) Patent No.: US 7,505,885 B2
(45) Date of Patent: Mar. 17, 2009

(54) METHOD AND INTERFACE ELEMENTS FOR FINITE-ELEMENT FRACTURE ANALYSIS

(75) Inventors: Lyle R. Deobald, Shoreline, WA (US); Bernhard Dopker, Bellevue, WA (US); Gerald E. Mabson, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 494 days.

(21) Appl. No.: 10/350,545

(22) Filed: Jan. 24, 2003

(65) Prior Publication Data
US 2004/0148143 A1 Jul. 29, 2004

(51) Int. Cl.
*G06F 9/455* (2006.01)

(52) U.S. Cl. ............... 703/7; 703/2; 703/6; 73/799; 73/826; 73/760; 73/845; 428/304.4; 428/411.1

(58) Field of Classification Search .......... 703/2, 703/6, 7; 73/826, 799, 847, 82, 849; 700/175; 175/374; 83/13; 702/48, 35; 428/314.4, 428/411.1, 174, 686, 304.4
See application file for complete search history.

(56) References Cited

U.S. PATENT DOCUMENTS

| | | | | |
|---|---|---|---|---|
| 4,567,774 | A * | 2/1986 | Manahan et al. | 73/826 |
| 5,377,116 | A * | 12/1994 | Wayne et al. | 700/175 |
| 5,602,329 | A * | 2/1997 | Haubensak | 73/82 |
| 5,826,213 | A * | 10/1998 | Kennefick | 702/35 |
| 6,634,236 | B2 * | 10/2003 | Mars | 73/799 |
| 6,663,803 | B1 * | 12/2003 | Gipple et al. | 264/40.1 |
| 6,732,057 | B2 * | 5/2004 | Hamad | 702/42 |
| 6,804,635 | B1 * | 10/2004 | Dhondt | 703/2 |
| 6,878,466 | B1 * | 4/2005 | Lange et al. | 428/686 |
| 6,939,603 | B2 * | 9/2005 | Oechsner | 428/304.4 |
| 7,016,825 | B1 * | 3/2006 | Tryon, III | 703/6 |
| 2002/0007972 | A1 * | 1/2002 | Yong et al. | 175/374 |
| 2002/0139194 | A1 * | 10/2002 | Mars | 73/799 |
| 2002/0155162 | A1 * | 10/2002 | Ascenzi et al. | 424/549 |
| 2002/0170360 | A1 * | 11/2002 | Anand et al. | 73/849 |
| 2003/0024323 | A1 * | 2/2003 | Wang et al. | 73/847 |
| 2003/0131699 | A1 * | 7/2003 | Lai et al. | 83/13 |
| 2003/0147615 | A1 * | 8/2003 | Szum et al. | 385/128 |
| 2003/0152760 | A1 * | 8/2003 | Lai et al. | 428/314.4 |
| 2003/0226935 | A1 * | 12/2003 | Garratt et al. | 244/123 |

(Continued)

OTHER PUBLICATIONS

E.F. Ryvicki and M.F. Kanninen, A Finite Element Calculation Of Stress Intensity Factors By A Modified Crack Closure Integral, *Engineering Fracture Mechanics*, 1977, pp. 931-938, vol. 9, Pergamon Press, Great Britain.

(Continued)

*Primary Examiner*—Paul L Rodriguez
*Assistant Examiner*—Kandasamt Thangavelu
(74) *Attorney, Agent, or Firm*—Alston & Bird LLP

(57) ABSTRACT

A finite element method for predicting crack opening and propagation entails defining a succession of overlapping interface elements at a potential crack plane, each element having a bound node pair and side node pairs spaced from the bound node pair to sense approach of a crack. An energy-based fracture mechanics criterion determines whether release occurs at the bound nodes and, if so, the displacement between the bound nodes is calculated based on a strain softening law. The process is repeated for each element in sequence.

30 Claims, 5 Drawing Sheets

U.S. PATENT DOCUMENTS

| | | | |
|---|---|---|---|
| 2004/0031337 A1* | 2/2004 | Masaniello et al. | 73/865.8 |
| 2004/0035979 A1* | 2/2004 | McCoskey et al. | 244/117 R |
| 2004/0055666 A1* | 3/2004 | Forrest et al. | 148/400 |
| 2004/0099958 A1* | 5/2004 | Schildgen et al. | 257/778 |
| 2004/0142152 A1* | 7/2004 | Chen et al. | 428/174 |
| 2005/0053787 A1* | 3/2005 | Yamasaki et al. | 428/411.1 |

OTHER PUBLICATIONS

C.C. Rankin, F.A.Brogan and E. Riks, Some Computational Tools For The Analysis Of Through Cracks In Stiffened Fuselage Shells, *Computational Mechanics*, 1993, pp. 143-156, vol. 13.

D. Hitchings, P. Robinson and F. Javidrad, A Finite Element Model For Delamination Propagation In Composites, *Computers & Structures*, 1996, pp. 1093-1104, vol. 60, Pergamon Press.

M.A. Crisfield, Y. Mi, G.A.O. Davies and H-B. Hellweg, Finite Element Methods And The Progressive Failure-Modeling Of Composites Structures, *Computational Plasticity: Fundamentals and Applications*, 1997, pp. 239-254, Part I, CIMNE, Barcelona.

M. Wisheart and M.O.W. Richardson, The Finite Element Analysis Of Impact Induced Delamination In Composite Materials Using A Novel Interface Element, *Composites Part A 29A*, 1998, pp. 301-313.

De Xie, Damage Progression In Tailored Laminated Panels With A Cutout And Delamination Growth In Sandwich Panels With Tailored Face Sheets, *A Dissertation Presented To The Graduate School Of Clemson University*, Dec. 2002.

* cited by examiner

METHOD AND INTERFACE ELEMENTS FOR FINITE-ELEMENT FRACTURE ANALYSIS

FEDERALLY SPONSORED RESEARCH AND DEVELOPMENT

This invention was made with Government support under Contract F33615-98-3-5103 awarded by the Department of the Air Force. The Government has certain rights in this invention.

FIELD OF THE INVENTION

The present invention relates to finite element structural analysis methods, and more particularly to methods for analyzing crack initiation and propagation in a material using finite element computer modeling.

BACKGROUND OF THE INVENTION

The prediction of crack initiation and propagation in a material using existing finite element computer modeling techniques has been hampered by a number of limitations of the techniques. The existing techniques cannot easily predict the initiation or propagation of cracks in structures containing material or geometric non-linearities or exhibiting non-linear material or geometric response (e.g., as a result of large displacements), cannot easily predict the propagation of multiple crack tips on one-dimensional cracks (either two tips on a single crack, or multiple cracks), and cannot easily handle finite area cracks involving crack fronts.

Two primary approaches have typically been used to predict the initiation and/or the propagation of cracks in layered materials. In one approach, critical energy release rate components govern the growth of the crack. The crack plane is modeled by coincident nodes that are released manually by using the well-known virtual crack closure (VCC) technique [see, for example, Rybicki, E. F. and Kanninen, M. F., "A Finite Element Calculation of Stress Intensity Factors by a Modified Crack Closure Integral", *Engineering Fracture Mechanics*, Vol. 9, pp. 931-938 (1977, Pergamon Press)]. The crack tip energy release rate components can be determined from a finite element model with arbitrary non-zero loading on the modeled structure. The crack tip energy release rate components can easily be scaled to the condition where crack propagation will occur if the model is linear. The appropriate nodes along a predetermined crack path can be released and the crack can be propagated for a single one-dimensional crack with a single crack tip. The scaling procedure normally occurs outside the finite element code, after the finite element model has been run on the computer. For a general description of this technique, see Hitchings, D., Robinson, P., and Javidrad, F., "A Finite Element Model for Delamination Propagation in Composites", *Computers & Structures*, Vol. 60, No. 6, pp. 1093-1104 (1996, Pergamon Press). In this technique, multiple computer runs are required to propagate the crack, each run corresponding to a different crack length. The technique requires tedious post-processing of multiple finite element solutions. Additionally, if non-linearities exist in the model, difficulties arise in determining the load at which the crack tip energy release rate components would result in crack propagation to occur. Therefore, many experts consider this approach generally applicable only to linear problems. This approach is not practical for addressing problems containing multiple crack tips on one-dimensional cracks, or finite-area cracks.

Traditional interface elements have also been used in finite element models to calculate the propagation of cracks. Such elements invariably require critical release forces, pressures, displacements, or strains to be input to the model, which are then used by the elements to control the release of the interface. To simulate fracture, the critical release forces, pressures, displacements, or strains can be determined using known single mode critical energy release rates, a mixed mode fracture criteria, local finite element model mesh sizes, and stiffnesses. For a general description of traditional interface element approaches, see Wisheart, M. and Richardson, M. O. W., "The Finite Element Analysis of Impact Induced Delamination in Composite Materials Using a Novel Interface Element", *Composites Part A*, 29A, pp. 301-313 (1998, Elsevier Science Ltd.); Crisfield, M. A., Mi, Y., Davies, G. A. O., and Hellweg, H-B., "Finite Element Methods and the Progressive Failure-Modelling of Composites Structures", *Computational Plasticity: Fundamentals and Applications '97*, CIMNE, Barcelona, Part 1, pp. 239-254 (1997, D. R. J. Owen et al., eds.). Unfortunately, the critical release forces, pressures, displacements, or strains change when the loading is different from that used for calibration, and are dependent on the local mesh size used. This mesh dependence of the release "strength" is particularly troubling for finite-area cracks, as the element aspect ratios may be required to be specific values in the model for the crack to propagate correctly. For these reasons, traditional interface elements have not found widespread use by many technical experts in the fracture mechanics field.

SUMMARY OF THE INVENTION

The present invention addresses the above needs and achieves other advantages, by providing a method for predicting the first extension and propagation of a crack in a structure through finite element modeling, whereby in a single run of the finite element model the crack can be propagated over a plurality of interface elements defined along the crack interface. In this regard, a crack tip may be modeled as at least a triad of node pairs along a potential crack plane in the structure. Thereafter, crack growth may be simulated based upon: (a) initial node release that is governed by a relationship between calculated energy release rate components, attributable to external loading on the structure, and a mixed mode fracture criterion that includes material dependent critical energy release rates and mode interaction constants, and (b) a strain softening law which governs the relationship between the model forces and displacements after initial node release.

In accordance with one embodiment of the invention, a method for predicting the propagation of a crack along a first direction along a potential crack plane in a structure using a finite element computer model comprises the steps of:

defining an interface element at an interface between adjacent first and second layers of the structure, the interface element comprising a plurality of node pairs spaced apart in the first direction, each node pair comprising a first node located at the first layer at the interface and a second node located at the second layer at the interface and coincident in position with said first node when there is no crack opening between the first and second layers at the node pair, the node pairs comprising a middle bound node pair and at least two additional side node pairs spaced on opposite sides of the bound node pair;

establishing a crack between the layers such that a front of the crack is located at the bound node pair and there is a finite non-zero displacement, calculated during the analysis, between one of the side node pairs, the bound node pair having input stiffnesses therebetween of effectively infinite magnitudes and the side node pairs each having effectively zero stiffnesses therebetween;

inputting to the finite element computer model a mixed mode fracture criterion governing propagation of the crack; and using the model to incrementally increase an external loading on the structure and, at each incremented external loading, to:

calculate at least one interlaminar force between the bound node pair;

calculate associated energy release rate components at the bound node pair based on the calculated interlaminar forces at the bound node pair and the displacements, calculated during the analysis, at said side node pair; and initiate release of the bound node pair if the calculated energy release rate components cause the mixed mode fracture criterion to predict crack propagation.

Preferably, the model is used to determine critical interlaminar forces at which the calculated energy release rate components cause the mixed mode fracture criterion to predict crack propagation, and to calculate critical displacements between the released nodes based on the critical interlaminar forces and the mixed mode fracture criterion. For example, in preferred embodiments the displacements between the released nodes are determined by assuming a predetermined shape (e.g., linear) for the force-displacement curves and determining the force-displacement curves having such shape that pass through the critical interlaminar forces at zero displacements and bounds a known area dictated by the mixed mode fracture criterion.

The method preferably includes the step of defining a succession of interface elements spaced along the first direction such that the interface elements overlap one another, displacements calculated between released nodes of one interface element being subsequently used to determine whether the crack propagates to and causes release of bound nodes of a next succeeding interface element. In this manner, the crack can be propagated over a succession of interface elements within a single run of the computer model.

The interface element for a one-dimensional crack propagation comprises at least three first nodes N1, N2, and N3 spaced known distances apart along the first direction at the interface along the first layer and at least three second nodes N4, N5, and N6 spaced apart along the first direction at the interface along the second layer of the structure. The nodes are arranged in node pairs N1 and N6, N2 and N5, and N3 and N4. A tip or front of the crack is assumed to be located at the middle node pair N2, N5, and thus middle nodes N2 and N5 are coincident and bound together. Assuming the crack is approaching the middle node pair from the direction of side node pair N1, N6, initially side node pair N1 and N6 have a nonzero displacement therebetween indicating the crack has opened there. The opposite side node pair N3 and N4 are coincident, since the crack has not yet reached that location. Effectively infinite stiffnesses are initially defined between the middle node pair N2 and N5 and zero stiffnesses are defined between the remaining node pairs. The critical interlaminar forces and displacements are calculated between the middle node pair N2 and N5.

The method can be used for pure mode I or mode II conditions, or in mixed-mode conditions. Curves of various forms can be used to relate the interlaminar forces to the displacements where the area under the curves is governed by energy release rate components and the mixed mode fracture criterion. For pure tensile mode I conditions, a critical displacement $v_{2,5\ crit}$ at which an interlaminar tensile load goes to zero is determined based on a linear load-displacement relationship as $$v_{2,5crit} = \frac{2G_{IC} \cdot d_R \cdot b}{F_{v,2,5crit}}$$

where $G_{IC}$ is a predetermined mode I critical energy release rate, $d_R$ is the distance between the side nodes N3, N4 and the middle nodes N2, N5, b is a predetermined width of the interface element, and $F_{v,2,5\ crit}$ is the calculated critical interlaminar force.

Preferably, in pure mode I conditions the nodes N2 and N5 are initiated to release when $$(v^* \cdot F_{v,2,5})/(2b \cdot d_R) \geq G_{IC}.$$

where $v^*$ is a relative displacement in a vertical direction perpendicular to a plane of the interface at a distance $d_R$ from nodes N2 and N5 in the direction of side nodes N1 and N6, and $F_{v,2,5}$ is a calculated interlaminar tensile force at the middle nodes N2 and N5.

Various methods can be used to calculate $v^*$. If the displacement v varies linearly with distance from the middle node pair N2, N5 in the direction of side node pair N1, N6, then $$v^* = v_{1,6}(d_R/d_L)$$

where $d_R$ is the distance between the middle node pair N2, N5 and the side node pair N3, N4, and $d_L$ is the distance between the middle node pair N2, N5 and the other side node pair N1, N6.

In pure shear mode II conditions, the nodes N2 and N5 are initiated to release when $$(u^* \cdot F_{h,2,5})/(2b \cdot d_R) \geq G_{IIC}$$

where $u^*$ is the relative displacement in a horizontal direction parallel to a plane of the interface and perpendicular to the first direction at a distance $d_R$ from nodes N2 and N5 in the direction of side nodes N1 and N6, $F_{h,2,5}$ is a calculated interlaminar shear force at the middle node pair N2 and N5, b is a predetermined width of the interface element, and $G_{IIC}$ is a predetermined critical energy release rate for mode II.

Various methods can be used to calculate $u^*$. If the displacement u vanries linearly with distance from the middle node pair N2, N5 in the direction of side node pair N1, N6, then $$u^* = u_{1,6}(d_R/d_L)$$

where $d_R$ is the distance between the middle node pair N2, N5 and the side node pair N3, N4, and $d_L$ is the distance between the middle node pair N2, N5 and the other side node pair N1, N6.

In mixed mode I and mode II conditions, the crack can be determined to open at the middle node pair N2, N5 using various interaction laws. For example, it can be assumed that the crack opens at the middle node pair N2 and N5 when $$\left(\frac{G_I}{G_{IC}}\right)^m + \left(\frac{G_{II}}{G_{IIC}}\right)^n \geq 1$$

where m and n are predetermined material constants, $G_I$ and $G_{IC}$ are respectively a calculated mode I component energy release rate and a critical energy release rate for pure mode I conditions, and $G_{II}$ and $G_{IIC}$ are respectively a calculated mode II component energy release rate and a critical energy release rate for pure mode II conditions.

As noted, preferably a sequence of interface elements are defined extending along the first direction along a potential crack plane. The interface elements overlap such that side nodes of each interface element are coincident with the middle nodes of at least one other adjacent interface element. In accordance with the invention, the method comprises propagating a crack along the first direction by (a) determining whether the crack opens and calculating the relative displacements between the middle node pair N2 and N5 of one interface element, (b) effectively equating, by virtue of their overlapped position, the calculated displacements to the displacements between the side nodes of an adjacent interface element and then determining whether the crack opens and calculating the displacements between the middle node pair N2 and N5 of the adjacent interface element, and repeating steps (a) and (b) for each interface element in sequence as the crack propagates. Preferably, the method is carried out with a computer finite element model having a non-linear solver, and the crack is propagated over a plurality of interface elements within a single run of the finite element model. In this regard, a corresponding computer program product is provided according to other aspects of the present invention for predicting the propagation of a crack along a potential crack plane using a finite element model.

BRIEF DESCRIPTION OF THE DRAWINGS

The above and other objects, features, and advantages of the invention will become more apparent from the following description of certain preferred embodiments thereof, when taken in conjunction with the accompanying drawings in which.

DETAILED DESCRIPTION OF THE INVENTION

Figure 1:
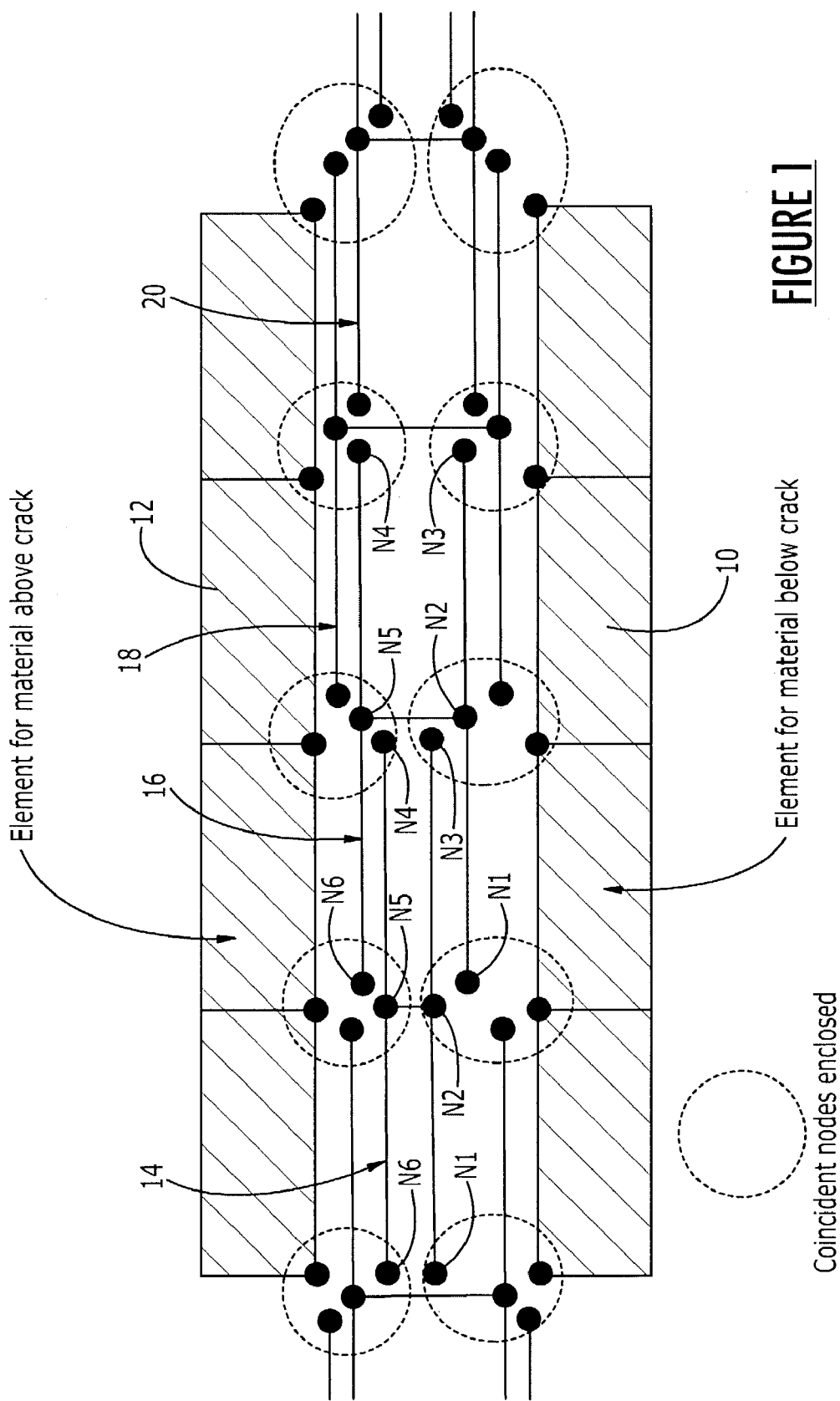
FIG. 1 is a diagram schematically depicting two layers of a structure with a potential crack plane therebetween, and showing a succession of overlapping interface elements defined at the crack plane in accordance with one embodiment of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The invention relates to a method for predicting the behavior of a crack in a structure (e.g., a composite member, a metal member, etc.) subjected to external loading that may cause the crack to grow in length, such growth being referred to herein as "propagation" of the crack. The method of the invention is advantageously implemented within a finite element model (FEM) on a computer. Finite element modeling of structures is widely used for determining stress and strain distributions as a result of external loading applied to the structure, and hence no general discussion of finite element modeling techniques need be presented here.

It is well known that a FEM is not capable of accurately determining the stress and strain state, in a single model, in the vicinity of a singularity of a propagating crack tip or front. For that reason, crack propagation prediction techniques that rely on the FEM-calculated stress and strain at the crack front are not favored. The present invention takes a different approach that does not rely on the stress and strain at the crack front. In accordance with the invention, interface elements are defined at the potential crack plane (e.g., the interface between two lamina in a multi-layer composite structure) that effectively model a crack tip as at least a triad of node pairs along the potential crack plane in the structure. In this regard, each interface element includes a plurality of node pairs located at the potential crack plane and spaced apart along a predetermined direction. Prior to the crack opening at any given node pair, the nodes of the pair are coincident. A designated node pair, located generally in the "middle" of each interface element, constitutes a bound node pair having input stiffnesses between the nodes that are effectively infinite (in the computer model the stiffness is set to a very large finite value) as long as the crack has not opened at the bound node pair. Each of the other node pairs of each interface element, referred to herein as "side" node pairs, has effectively zero stiffnesses between its nodes.

The invention provides a method for predicting when a crack front, located at a bound middle node pair of an interface element, will "open" at the middle node pair. The prediction scheme is based on energy-based fracture mechanics criteria. The method is advantageous in that release of the bound nodes is predicted during the actual FEM computer run, as opposed to relying on post-processing of a completed FEM solution to determine whether release will occur. Accordingly, propagation of a crack over a plurality of successive interface elements can be predicted in a single FEM computer run. It is believed the energy-based fracture mechanics criteria employed in the method faithfully model the actual physics not only of the strain-softening phenomenon that occurs after release when the crack tip location is at an intermediate position between nodes, but also the actual release itself.

FIG. 1 shows in schematic form a succession of simple interface elements in accordance with the invention. A structure is represented in the figure as having a first layer 10 and a second layer 12 between which an interface is defined. For purposes of clarity to simplify, the layers 10, 12 are shown as being separated, but, in reality, the facing surfaces of the layers are coincident when no crack has opened at the interface. The interface between the layers represents a potential crack plane along which an already established crack may propagate. Along the potential crack plane, a plurality of interface elements 14, 16, 18, 20, etc., are defined. In this simple 2-D example, each interface element comprises three node pairs spaced apart along the potential crack plane.

Thus, interface element 14 comprises nodes N1, N2, and N3 located at the interface on the first layer 10 of the structure and spaced apart in a predetermined direction, and nodes N4, N5, and N6 located at the interface on the second layer 12 and spaced apart in the predetermined direction. When no crack is opened between the layers, nodes N1 and N6 form a coincident node pair, nodes N2 and N5 form a coincident node pair, and nodes N3 and N4 form a coincident node pair. The middle node pair N2, N5 constitutes a bound node pair for which effectively infinite stiffnesses are input to the FEM. Each of the side node pairs N1, N6 and N3, N4 has input stiffnesses that are zero, or effectively zero.

The other interface elements 16, 18, 20, etc., are similar to the element 14 as described above. Element 16 overlaps element 14, such that side node pair N3, N4 of element 14 is coincident with middle node pair N2, N5 of element 16. Likewise, element 18 overlaps element 16, element 20 overlaps element 18, and so forth. Thus, the middle bound node pair of each interface element is coincident with a side node pair of at least one other interface element located to one side or the other, or on both sides, of the particular interface element.

The side node pairs of each interface element are used as "antenna" nodes to sense the approach of a crack from either direction toward the bound node pair of the element. Whether the crack opens at the bound node pair is predicted using energy-based fracture mechanics. More particularly, initiation of release of the bound node pair is permitted when the energy release rate components at the bound node pair cause the mixed mode fracture criterion to predict crack propagation. As described below, the mixed mode fracture criterion contains predetermined material dependent critical energy release rates and mode interaction constants.

Figure 2:
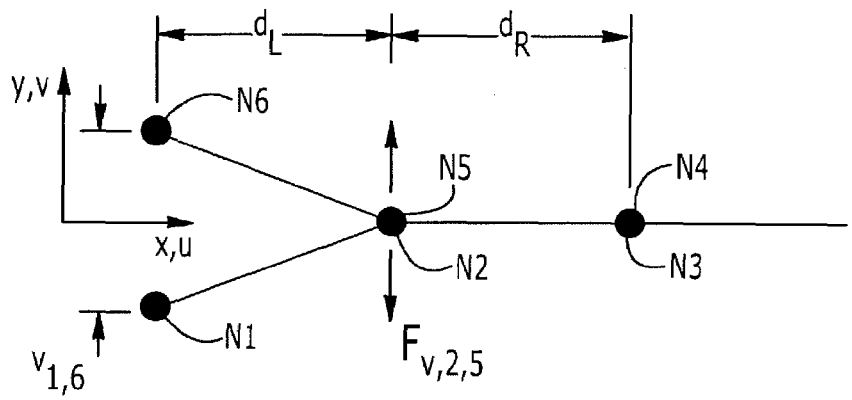
FIG. 2 is a diagram of a single one of the interface elements, showing a crack propagating left to right.

FIG. 2 depicts a 2-D interface element located at the crack front of an already established crack, in a pure mode I tensile load condition. The crack front is located at the middle bound node pair N2, N5 of the interface element. In this example, the crack is approaching from the left and thus there is a displacement $v_{1,6}$ between nodes N1 and N6 in the vertical direction defined by the y-axis. Prior to release of the bound nodes N2, N5, there are effectively infinite stiffnesses between them.

Using the FEM computer model, external loading is applied to the structure in a series of increasing increments and at each increment the FEM calculates the interlaminar forces $F_{v,2,5}$ that act in the vertical direction tending to pull the bound nodes apart. For tensile interlaminar force $F_{v,2,5}$, an energy release rate $G_I$ is then calculated for the bound nodes and is used to determine whether the nodes will release as a result of the interlaminar forces. No node release is initiated for compression interlaminar force $F_{v,2,5}$. In accordance with the invention, the bound nodes are initiated to release when the calculated energy release rate $G_I$ equals or exceeds the known critical mode I energy release rate $G_{IC}$. More specifically, release is initiated when For $F_{v,2,5} > 0$:

$$\frac{1}{2}\frac{v^* \cdot F_{v,2,5}}{b \cdot d_R} \geq G_{IC}$$

or $$\frac{1}{2}\frac{v_{1,6} \cdot F_{v,2,5}}{b \cdot d_L} \geq G_{IC}$$

where the left-hand side of the expression constitutes the energy release rate $G_I$, $d_R$ is the distance between the bound node pair and the side node pair N3, N4, $d_L$ is the distance between the bound node pair and the other side node pair N1, N6, and b is the width of the interface element in the direction orthogonal to the x- and y-axes. If the calculated energy release rate does not exceed the critical value at the particular loading increment, the loading is incremented further and the process is repeated, and so on, up to whatever maximum loading has been selected. Note that the equations shown above can be readily modified to include energy terms arising from rotations (in addition to displacements) if appropriate.

It is possible that even at the maximum loading, the calculated energy release rate does not exceed the critical value such that the crack does not open at the bound nodes N2, N5. However, the more interesting case is what happens if at some loading increment the calculated energy release rate just equals the critical value. At that loading increment, the bound nodes are initiated to release. The interlaminar force that exists at the bound nodes when the calculated energy release rate just equals the critical value is referred to herein as the critical interlaminar force, $F_{v,2,5\ crit}$. The behavior of the crack at the released nodes N2, N5 is then governed by a computed strain softening law that relates the interlaminar force, or so-called residual force, to the displacement between the nodes and to the critical energy release rate. As the crack opens at the released nodes, the residual force on the nodes tends to diminish until at some point the residual force is zero; the total displacement between the nodes at that point is referred to as the critical displacement, $v_{2,5\ crit}$.

Figure 3:
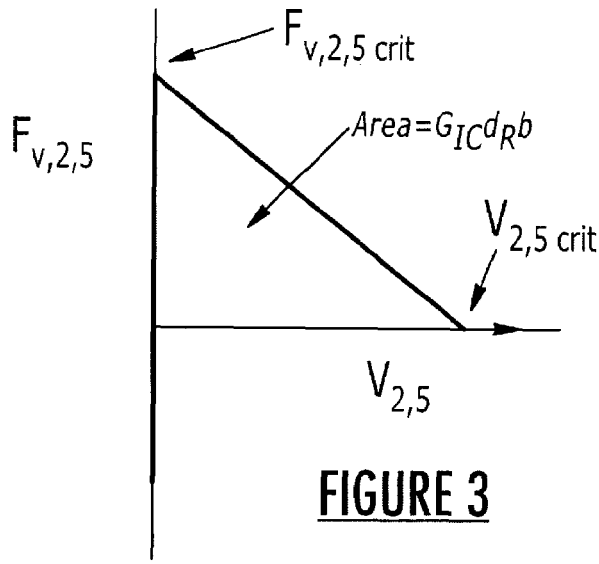
FIG. 3 shows an exemplary linear strain-softening law that can be used in the method in accordance with one embodiment of the invention.

Strain softening laws are well known, and various ones can be used in the method of the invention. FIG. 3 depicts just one example of a strain softening law that is linear. The area under the force-displacement curve is related to the critical energy release rate $G_{IC}$. As noted, the maximum force that exists at zero displacement is the critical interlaminar force $F_{v,2,5\ crit}$, and the minimum displacement that exists at zero force after unloading is the critical displacement $v_{2,5\ crit}$. Mathematically, the linear strain softening law is expressed as $$F_{v,2,5} = F_{v,2,5crit}\left(1 - \frac{v_{2,5}}{v_{2,5crit}}\right) \text{ for } 0 < v_{2,5} < v_{2,5crit}$$

$$F_{v,2,5} = 0 \text{ for } v_{2,5} \geq v_{2,5crit}$$

where $$v_{2,5crit} = \frac{2G_{IC} \cdot d_R \cdot b}{F_{v,2,5crit}}$$

All of the quantities on the right-hand side of the equation are either known constants or are calculated by the FEM during an iteration. Thus, the computer FEM is able to calculate the critical displacement $v_{2,5\ crit}$, thereby establishing the two axes intercepts for the curve in FIG. 3. Then, based on the strain softening law and the calculated residual force $F_{v,2,5}$, the FEM calculates the displacement $v_{2,5}$ between the released nodes N2, N5.

Under pure shear mode 11 conditions, an analogous method is employed, but the equations are slightly different. In mode II, release of the bound nodes N2, N5 is initiated when $$\frac{1}{2}\frac{u^* \cdot |F_{h,2,5}|}{b \cdot d_R} \geq G_{IIC}$$

where $$u^* = |u_{1,6}|\left(\frac{d_R}{d_L}\right)$$

where $u_{1,6}$ is the displacement between nodes N1, N6 in the direction of the x-axis in FIG. 2 and $G_{IIC}$ is the mode II critical energy release rate. The strain softening law for mode II conditions, assuming a linear relationship, is expressed as $$F_{h,2,5} = |F_{h,2,5crit}|\left(1 - \frac{u_{2,5}}{u_{2,5crit}}\right)\frac{u_{2,5}}{|u_{2,5}|}, \text{ for } |u_{2,5}| < |u_{2,5crit}|$$

$$F_{h,2,5} = 0, \text{ for } |u_{2,5}| \geq |u_{2,5crit}|$$

where $$u_{2,5crit} = \frac{2G_{IIC} \cdot d_R \cdot b}{F_{h,2,5crit}}$$

In general, pure mode I or mode II conditions will not exist. Rather, a mix of mode I and mode II generally will exist in the 2-D situation (and, in a 3-D situation a mix of mode I, mode II, and mode III often will exist). Thus, an interaction law, that is a mixed mode fracture criterion, is needed to define when release will occur under these mixed-mode conditions. In the 2-D situation, the interaction law will be a function of $G_I$, $G_{IC}$, $G_{II}$, and $G_{IIC}$. Various interaction laws can be devised. As one example of a suitable interaction law that can be used, release can be initiated when $$\left(\frac{G_I}{G_{IC}}\right)^m + \left(\frac{G_{II}}{G_{IIC}}\right)^n \geq 1$$

where m and n are material constants that are input to the computer FEM.

Thus far, consideration has been given only to what happens at a single interface element. However, in practical application, to predict propagation of a crack a series of overlapping interface elements are used as previously discussed and as shown in FIG. 1. The general procedure is as follows: Starting with the interface element at which the already established crack front is located, the calculations discussed above are made to determine whether the crack opens at the bound nodes of the interface element and, assuming the crack does open, the displacements between the released nodes are calculated. Since the side node pair of the next successive interface element in the direction of crack propagation is coincident with the released nodes of the first element, the displacements between the side node pair of the next element are known. Accordingly, the same calculation process can be repeated for the next element, and so on. Thus, the crack can be propagated over a plurality of successive interface elements within a single run of the computer FEM.

Figure 4:
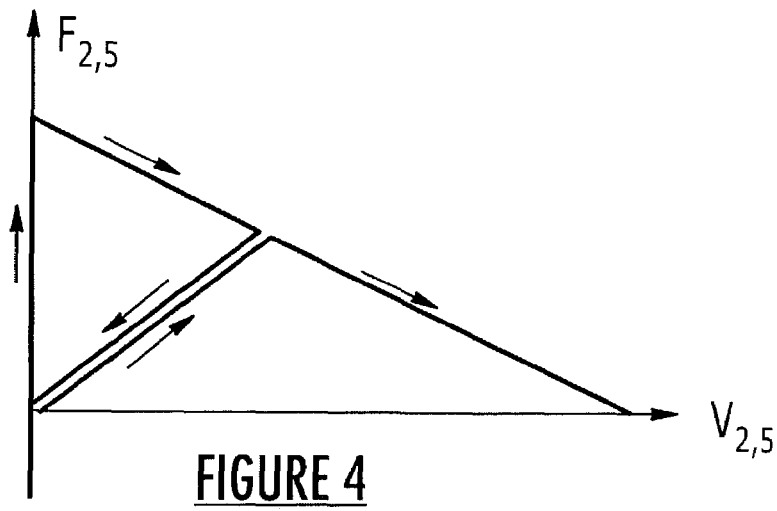
FIG. 4 depicts a force-displacement unloading path in accordance with one advantageous embodiment of the invention.

In some circumstances it is possible for the displacements at the bound nodes to decrease when the released interface element is in a state of strain softening. Accordingly, it is necessary to build into the FEM interface element an unloading/loading behavior for the material to prevent a crack from "self-healing". This can be accomplished in various ways, but one suitable approach is depicted in FIG. 4. In the example used above in which the crack approaches from side node pair N1, N6, it is assumed that the unloading occurs from the strain softening curve straight toward the origin; if and when the forces increase again after the unloading, the loading retraces the unloading path back up to the strain softening curve and then proceeds down the curve. Interpenetration, where $v_{1,6}$ is less than zero, (see FIG. 2) is not allowed.

The interface elements preferably have equal spacing between node pairs, but such cannot always be accomplished within the geometric constraints of a particular structure being analyzed. To accommodate unequal spacing (i.e., where $d_R$ does not equal $d_L$ in FIG. 2), an interpolation/extrapolation scheme is employed to determine the displacement between nodes at a distance from the crack front that is equal to the distance from the crack front to the coincident node pair ahead of the crack front. Thus, where the crack is open at nodes N1, N6 and propagating in the direction of nodes N3, N4 as in FIG. 2, a displacement v* is calculated at a location that is a distance $d_R$ to the left of the bound node pair N2, N5. Various interpolation and extrapolation schemes can be used. The simplest scheme is to assume that displacement varies linearly with distance from the bound node pair. Thus, $$v^* = v_{1,6}(d_R/d_L).$$

Once the displacement v* is determined, the energy release rate is calculated based on this displacement. For instance, in mode I conditions, release is initiated when $$(v^* \cdot F_{v,2,5})/(2b \cdot d_R) = G_{IC}.$$

A similar approach is used for mode II release:

$$u^* = u_{1,6}(d_R/d_L),$$

and $$(u^* \cdot F_{h,2,5})/(2b \cdot d_R) = G_{IIC}.$$

Mixed-mode conditions are handled in a similar manner to that already explained.

Figure 5:
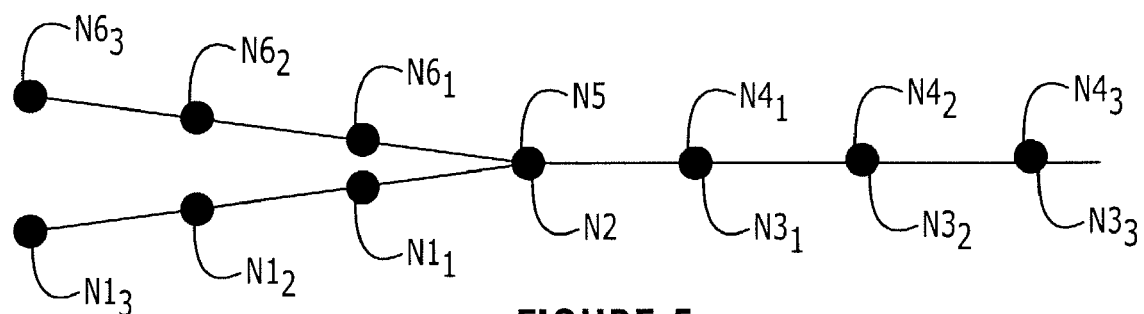
FIG. 5 shows a higher-order interface element in accordance with one embodiment of the invention.

Higher-order interface elements with more than three node pairs can be used in accordance with the invention. For instance, an interface element as shown in FIG. 5 can be used, wherein on either side of the bound node pair N2, N5 there are a plurality of side node pairs. Thus, to the left of the bound nodes the interface element has three node pairs $N1_{1-3}$ and $N6_{1-3}$ and to the right there are three node pairs $N3_{13}$ and $N4_{1-3}$. The interface element is able to "sense" the approach of a crack more than one node away from the bound node pair, and a more-sophisticated release criterion may be employed based on the relative displacements of the several node pairs adjacent to the bound node pair. Such higher-order interface elements can be used, for example, with quadratic FEM elements that contain nodes between their corner nodes.

Figure 6:
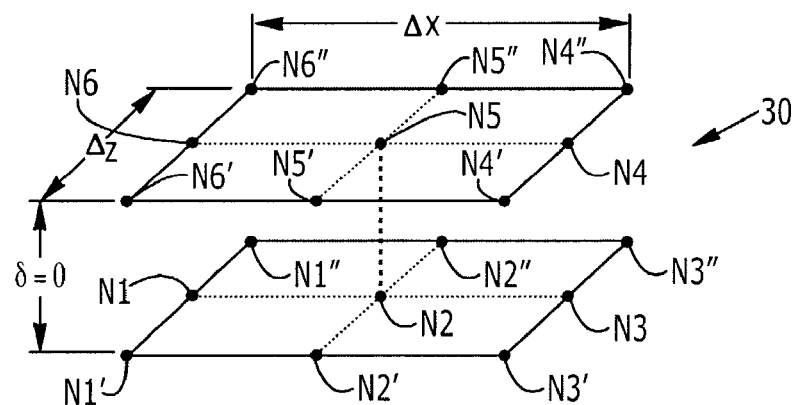
FIG. 6 shows a 3-D interface element in accordance with one embodiment of the invention.

The method of the invention is not limited to 2-dimensional applications but can be applied also to 3-dimensional applications with appropriate adaptations made to the geometry of the interface elements and the equations for determining initial release of the bound nodes, the strain softening law, and the mixed mode interaction law. FIG. 6 depicts an example of a 3-D interface element 30 in accordance with the invention.

As with the previously discussed interface elements, the 3-D interface element has a pair of bound nodes N2, N5. Along a first direction, such as the x-direction as shown in FIG. 6, the interface element has side node pairs N1, N6 and N3, N4 spaced on opposite sides of the bound node pair. In addition, the element has further side node pairs spaced in a second direction perpendicular to the first direction, which second direction is designated the z-direction in FIG. 6. More particularly, a pair of nodes N1', N1' are spaced on opposite sides of the side node N1 aligned along the z-axis, a pair of nodes N2', N2" are spaced on opposite sides of the node N2 along the z-axis, and so forth for each of the remaining x-direction nodes N3 through N6. A plurality of such 3-D elements 30 can be overlapped in both the x- and z-axis directions in a manner analogous to that shown in FIG. 1 so that crack propagation can be predicted along both the x- and z-axis directions simultaneously.

Whether the bound node pair N2, N5 releases will depend, in the general case, on the energy release rate components in mode I, mode II, and mode III in relation to the respective critical energy release rates for these modes, as well as the interaction between the modes. Accordingly, the release criterion must take all the modes and their interaction into account.

The interaction law, or mixed mode fracture criterion, governing release can be given, for example, by $$\left(\frac{G_I}{G_{IC}}\right)^m + \left(\frac{G_{II}}{G_{IIC}}\right)^n + \left(\frac{G_{III}}{G_{IIIC}}\right)^p \geq 1$$

where $G_{III}$, is the calculated mode III component energy release rate for mode III and $G_{IIIC}$ is the critical energy release rate for pure mode III, p is a predetermined material constant, and the other terms have the same meanings previously described.

A number of algorithms for calculating the energy release rate components for 3-dimensional applications can be used. One such algorithm follows. For one or two adjacent mid side node pairs partially or fully released, the energy release rate component equations for the square element with the central node pair in the center, shown in FIG. 6, are $$G_I = \frac{2F_{v,2,5} v_{max}}{A}$$

$$G_{II} = \frac{2F_{N,2,5} u_{N,max}}{A}$$

$$G_{III} = \frac{2F_{T,2,5} u_{T,max}}{A}$$

where
$F_{v,2,5}$=Force between nodes 2 and 5 in the Y direction
$F_{N,2,5}$=Force magnitude between nodes 2 and 5 in plane but normal to the crack front
$F_{T,2,5}$=Force magnitude between nodes 2 and 5 in plane but tangent or parallel to the crack front
$v_{max}$=Maximum displacement between any mid side node pair in the Y direction
$u_{N,max}$=Maximum magnitude displacement between any mid side node pair in plane but normal to the crack front
$u_{T,max}$=Maximum magnitude displacement between any mid side node pair in plane but tangent (or parallel) to the crack front
A=Area enclosed by nodes N1', N3', N3" and N1"

The location of the crack front can be approximately determined from the peripheral nodal pair displacements. Corrections to the energy release rate component equations can be readily made to accommodate non-square elements, based on the initial locations and displacements of the peripheral node pairs.

Propagation of through cracks in shell type structures, with out-of-plane curvatures, can also be simulated with these fracture interface elements using the equations for energy release rate component contributions listed in C. C. Rankin, F. A. Brogan, E. Riks, "Some Computational Tools for the Analysis of Through Cracks in Stiffened Fuselage Shells", Computational Mechanics (1993) 13, pp. 143-156.

The method of the invention is applicable to a wide variety of applications including those involving non-linearities arising from various causes. Accordingly, the method preferably is implemented as a computer program product having a computer readable storage medium for storing computer readable instructions for implementing a FEM and, in particular, a FEM having a non-linear solver. A suitable example is the general-purpose finite element code known as ABAQUS that may be suitably programmed to perform the method of the present invention as described above.

The computer readable instructions that are stored in the computer-readable storage medium, such as a memory device, can direct a computer or other programmable apparatus to function in a particular manner, such that the instructions stored in the computer-readable storage medium produce an article of manufacture including instruction which implement the various functions of the method described above. In this regard, the computer readable instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions of the method described above.

Figure 7:
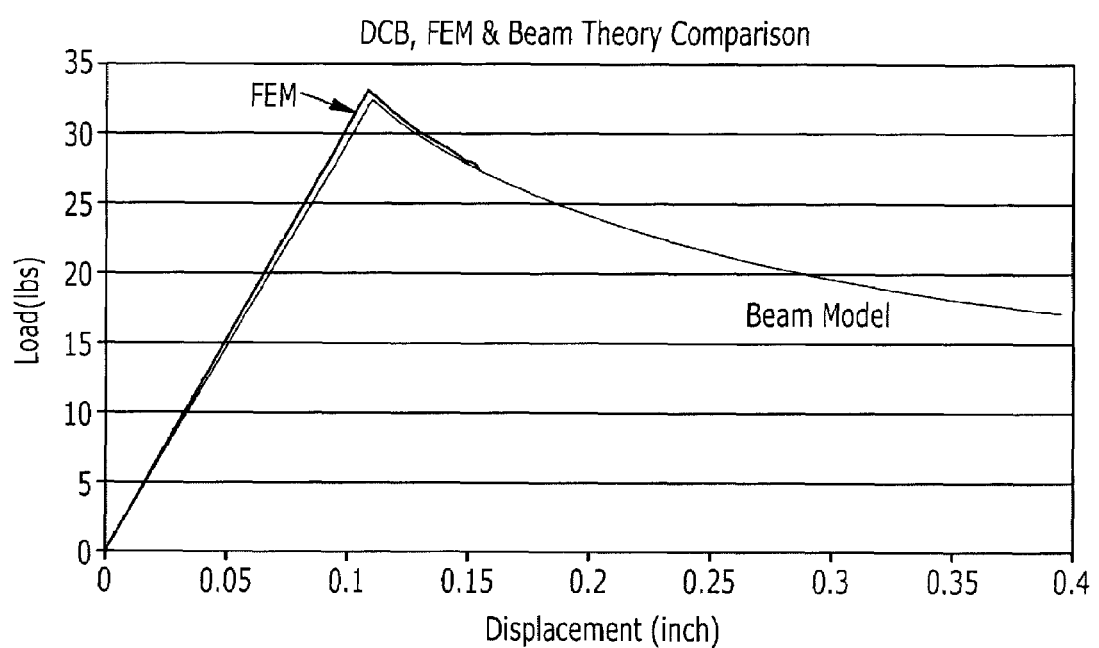
FIG. 7 is a plot showing load point displacement versus load (including crack propagation) for a double-cantilever beam (DCB) specimen in pure mode I loading conditions, comparing the solution obtained via a FEM method of one embodiment of the invention with that obtained from a theoretical beam solution.

By way of example, using ABAQUS with interface elements in accordance with the invention, a number of classical planar problems have been simulated and the results compared to theoretical solutions of the problems. FIG. 7 is a plot showing crack growth versus load for a double-cantilever beam (DCB) specimen (pure mode I), comparing the solution obtained via the FEM method of one embodiment of the invention with that obtained from a theoretical beam solution. The results show excellent agreement with the theoretical solution.

Figure 8:
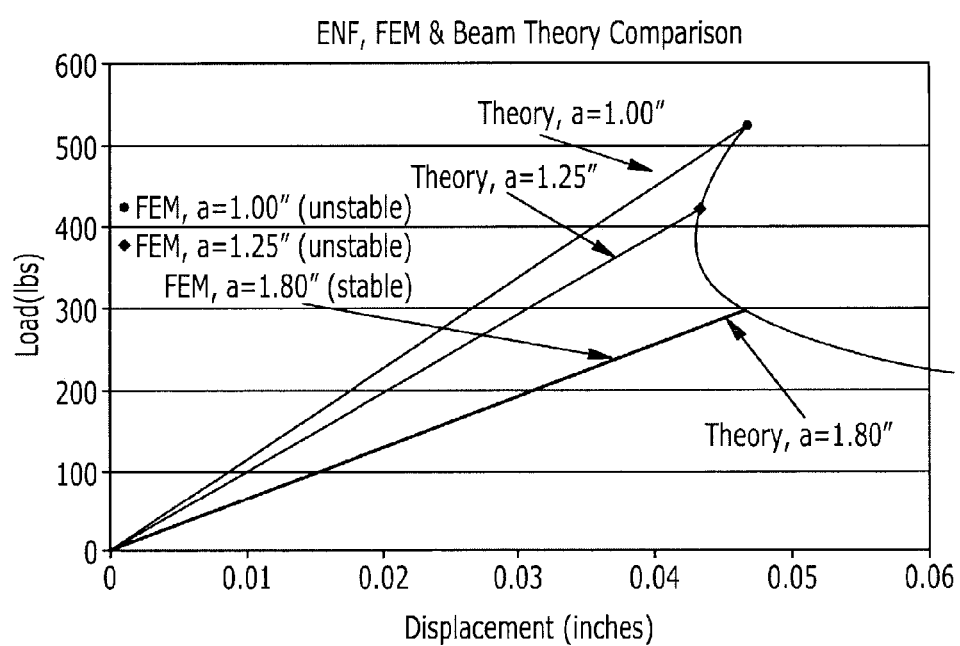
FIG. 8 is a plot showing load point displacement versus load (including crack propagation) for an end notched flexure (ENF) specimen in pure mode II loading conditions, comparing the solution obtained via a FEM method of one embodiment of the invention with that obtained from a theoretical beam solution for various initial crack lengths.

FIG. 8 compares several FEM solutions with corresponding theoretical beam solutions for a 1 inch wide by 0.3 inch thick end notch flexure (ENF) specimen (isotropic material properties). The test span is 4 inches with the load applied at the midpoint. The initial crack lengths measured from the outer support were a=1.00 inch, 1.25 inches, and 1.80 inches. Only the longest initial crack length yielded a stable FEM solution and the results for this solution agree very well with theory.

The method of the invention is not limited to single cracks or cracks with only one crack tip. Multiple cracks and cracks with multiple crack tips can be readily handled. Additionally, while it has been assumed above that a crack approaches the bound node pair N2, N5 from the direction of the node pair N1, N6, it will be understood that alternatively the crack can approach from the direction of the other node pair N3, N4, in which case the displacement(s) at node pair N3, N4 and the opposite side distances (i.e., $d_L$ instead of $d_R$, and vice versa) are used in calculating the energy release rate component(s), etc.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Specific terms are used in a generic and descriptive sense only and not for purposes of limitation.

What is claimed is:

1. A method for predicting initiation and propagation of a crack along a first direction along a potential crack plane in a structure using a finite element computer model, the method comprising:

defining a plurality of at least partially overlapping interface elements at an interface between adjacent first and second layers of the structure, each interface element comprising a plurality of node pairs spaced apart in the first direction, each node pair comprising a first node located at the first layer at the interface and a second node located at the second layer at the interface and coincident in position with said first node when there is no crack opening between said first and second layers at said node pair, the node pairs comprising a middle bound node pair and at least two additional side node pairs spaced on opposite sides of the bound node pair, wherein defining the plurality of at least partially overlapping interface elements comprises defining a succession of said interface elements spaced along the first direction such that one side node pair of one interface element is positioned at the middle bound node pair of an adjacent interface element;

establishing a crack between the layers such that a front of the crack is located at the bound node pair of a respective interface element and there is a finite non-zero displacement between the nodes of one of the side node pairs of the respective interface element, the nodes of the bound node pair having input stiffnesses therebetween of effectively infinite magnitudes and the nodes of each side node pair, including both the side node pair having the finite non-zero displacement and another side node pair having a pair of coincident nodes, having effectively zero stiffnesses therebetween;

inputting to the finite element computer model having a non-linear solver a mixed mode fracture criterion governing initiation and propagation of the crack;

incrementally increases an external loading on the structure using the model and, at each incremented external loading:

calculates at least one interlaminar force between the nodes of the bound node pair;

calculating associated energy release rate components at the middle bound node pair based on the calculated interlaminar forces between the nodes of the bound node pair and the displacements between the nodes of said side node pair of having the finite non-zero displacement therebetween; and initiating release of the bound node pair if the calculated energy release rate components cause the mixed mode fracture criterion to predict crack initiation and propagation; and incrementally propagating the crack over the plurality of at least partially overlapping interface elements within a single run of the finite element computer model by repeatedly and incrementally increasing the external loading on the structure using the model and initiating release of the bound node pair of each successive interface element.

2. The method of claim 1, further comprising calculating displacements between the nodes of a released node pair of one interface element, and using said calculated displacements to determine whether the crack propagates to and causes release of the nodes of a bound node pair of a next succeeding interface element.

3. The method of claim 1, further comprising:

using the model to determine at least one critical interlaminar force at which the calculated associated energy release rate components cause the mixed mode fracture criterion to predict crack initiation and propagation, and to calculate displacements between the nodes of the released node pair based on the critical interlaminar forces and the mixed mode fracture criterion.

4. The method of claim 3, wherein the displacements between the nodes of the released node pair are determined by assuming a predetermined shape for force-displacement curves and determining the force-displacement curves having said shape that pass through the critical interlaminar forces at zero displacements and bounds a known area dictated by the mixed mode fracture criterion.

5. The method of claim 1, wherein the respective interface element comprises three first nodes (N1, N2, N3) spaced known distances apart along the first direction at the interface along the first layer and three second nodes (N4, N5, N6) spaced apart along the first direction at the interface along the second layer, wherein the nodes are arranged in node pairs (N1, N6), (N2, N5), and (N3, N4), and wherein initially the side node pair (N1, N6) has a known nonzero displacement between nodes (N1, N6) indicating a crack has opened thereat, the nodes of the middle node pair (N2, N5) are coincident and bound together, and the nodes of the side node pair (N3, N4) are coincident, effectively infinite stiffnesses being initially defined between the nodes of the middle node pair (N2, N5) and zero stiffnesses being defined between the nodes of the remaining node pairs, and wherein the critical interlaminar forces and displacements are calculated between the nodes of the middle node pair (N2, N5).

6. The method of claim 5, wherein for pure tensile mode I conditions a critical displacement $v_{2,5\ crit}$ at which an interlaminar tensile load goes to zero is determined based on a predetermined load-displacement relationship that is a function of $G_{IC}$, $d_R$, b, and $F_{v,2,5\ crit}$, where $G_{IC}$ is a predetermined mode I critical energy release rate, $d_R$ is the distance between the side node pair (N3, N4) and the middle node pair (N2, N5), b is a predetermined width of the interface element, and $F_{v,2,5\ crit}$ is the calculated critical interlaminar force.

7. The method of claim 6, wherein the predetermined load-displacement relationship comprises a linear load-displacement relationship as $$v_{2,5crit} = \frac{2G_{IC} \cdot d_R \cdot b}{F_{v,2,5crit}}.$$

8. The method of claim 7, wherein the distance $d_L$ between side node pair (N1, N6) and bound node pair (N2, N5) is not equal to the distance $d_R$ between bound node pair (N2, N5) and side node pair (N3, N4), and wherein the nodes of the bound node pair (N2, N5) are initiated to release based on a calculated relative displacement v* at a location that is a distance $d_R$ from the bound node pair (N2, N5) in the direction of side node pair (N1, N6).

9. The method of claim 8, wherein for pure tensile mode I conditions the bound node pair (N2, N5) is released when $$(v^* \cdot F_{v,2,5})/(2b \cdot d_R) \geq G_{IC}.$$

10. The method of claim 9, wherein v* is assumed to be related to a relative displacement $v_{1,6}$ between nodes (N1, N6) by a predetermined functional relationship therebetween.

11. The method of claim 10, wherein the predetermined functional relationship is assumed to be a linear relationship as $$v^* = v_{1,6}(d_R/d_L).$$

12. The method of claim 5, wherein for pure shear mode II conditions a critical displacement $u_{2,5\ crit}$ at which an interlaminar shear load goes to zero is determined based on a predetermined load-displacement relationship that is a function of $G_{IIC}$, $d_R$, b, and $F_{h,2,5\ crit}$, where $G_{IIC}$ is a predetermined mode II critical energy release rate, $d_R$ is the distance between the side node pair (N3, N4) and the middle node pair (N2, N5), b is a predetermined width of the interface element, and $F_{h,2,5\ crit}$ is the calculated critical interlaminar force.

13. The method of claim 12, wherein the predetermined load-displacement relationship comprises a linear load-displacement relationship as $$u_{2,5crit} = \frac{2G_{IIC} \cdot d_R \cdot b}{F_{h,2,5crit}}.$$

14. The method of claim 13, wherein the distance $d_L$ between side node pair (N1, N6) and bound node pair (N2, N5) is not equal to the distance $d_R$ between bound node pair (N2, N5) and side node pair (N3, N4), and wherein the bound node pair (N2, N5) are initiated to release based on a calculated relative displacement u* at a location that is a distance $d_R$ from the bound node pair (N2, N5) in the direction of side node pair (N1, N6).

15. The method of claim 14, wherein for pure shear mode II conditions the bound node pair (N2, N5) is released when $$(u^* \cdot F_{h,2,5})/(2b \cdot d_R) \geq G_{IIC}.$$

16. The method of claim 15, wherein u* is assumed to be related to a relative displacement $u_{1,6}$ between nodes (N1, N6) by a predetermined functional relationship therebetween.

17. The method of claim 16, wherein the predetermined functional relationship is assumed to be a linear relationship as $$u^* = u_{1,6}(d_R/d_L).$$

18. The method of claim 5, wherein for mixed mode I and mode II conditions, the bound node pair (N2, N5) is initiated to release based on a predetermined interaction law that is a function of $G_I$, $G_{IC}$, $G_{II}$, and $G_{IIC}$, where $G_I$ and $G_{IC}$ are respectively a calculated mode I component energy release rate and a critical energy release rate for pure mode I conditions, and $G_{II}$ and $G_{IIC}$ are respectively a calculated mode II component energy release rate and a critical energy release rate for pure mode II conditions.

19. The method of claim 18, wherein the predetermined interaction law is $$\left(\frac{G_I}{G_{IC}}\right)^m + \left(\frac{G_{II}}{G_{IIC}}\right)^n \geq 1$$

where m and n are predetermined material constants.

20. The method of claim 5, wherein the interface elements overlap such that at least one side node pair of each interface element is coincident with the middle node pair of a succeeding interface element, and propagating a crack along the first direction by (a) determining that the crack opens and calculating the relative displacements between the nodes of the middle node pair (N2, N5) of one interface element, (b) effectively equating, by virtue of their overlapped position, said displacements to displacements between the side nodes of a succeeding interface element and then determining that the crack opens and calculating the displacements between the nodes of the middle node pair (N2, N5) of said succeeding interface element, and repeating steps (a) and (b) for each interface element in sequence as the crack propagates.

21. The method of claim 5, wherein the respective interface element comprises a plurality of side node pairs (N1$_i$, N6$_i$) spaced known distances apart on one side of the middle bound node pair (N2, N5), and a plurality of side node pairs (N3$_i$, N4$_i$) spaced known distances apart on the other side of the middle bound node pair (N2, N5), wherein initially each of side node pairs (N1$_i$, N6$_i$) has known nonzero relative displacements therebetween indicating a crack has opened thereat, middle node pair (N2, N5) is coincident and bound together, and each of opposite side node pairs (N3$_i$, N4$_i$) is coincident, effectively infinite stiffnesses being initially defined between the nodes of the middle bound node pair (N2, N5) and effectively zero stiffnesses being defined between the nodes of all side node pairs, and wherein the critical interlaminar forces and displacements are calculated between the nodes of the middle node pair (N2, N5).

22. The method of claim 21, wherein a predetermined criterion is defined based on relative displacements between the nodes of at least one of the side node pairs (N1$_i$, N6$_i$) and the forces between bound nodes (N2, N5), and said predetermined criterion is used to define initiation of release of the bound node pair (N2, N5).

23. The method of claim 5, wherein the respective interface element is defined to permit crack initiation and propagation in three-dimensional space by virtue of additional side node pairs spaced apart on opposite sides of the middle node pair (N2, N5) along a second direction lying in a plane of the interface and generally perpendicular to the first direction, and wherein crack initiation and propagation is calculated along both the first and second directions.

24. A method for predicting initiation and propagation of a crack along a potential crack plane in a structure using a finite element computer model, comprising the steps of:

defining a succession of overlapping interface elements along the potential crack plane extending along a first direction, each interface element comprising a middle node pair and at least two side node pairs spaced in the first direction on opposite sides of the middle node pair with the interface elements being overlapped such that one side node pair of one interface element is positioned at the middle node pair of an adjacent interface element, each node pair comprising a first node and a second node that are coincident when there is no crack opening at said node pair, the middle node pair of each interface element being coincident with a side node pair of a next overlapping interface element, wherein one of said interface elements is located such that a front of the crack is located at the middle node pair of said interface element and known displacements exist between the nodes of one of the side node pairs of said interface element, the nodes of the middle node pairs of all interface elements initially having input stiffnesses of effectively infinite magnitude such that the middle node pairs constitute bound node pairs, and the nodes of each side node pairs of all interface elements, including both the side node pair having the finite non-zero displacement and another side node pair having a pair of coincident nodes, having effectively zero stiffnesses therebetween;

inputting to the finite element computer model having a non-linear solver a mixed mode fracture criterion governing initiation and propagation of the crack; and performing a single run of the finite element computer model wherein the model incrementally increases an external loading on the structure and at each incremented external loading:

(a) calculates at least one interlaminar force on the middle node pair at which the crack front is located;

(b) calculates associated energy release rate components at the middle node pair of the interface element at which the crack front is located based on the calculated interlaminar forces between the nodes at said middle node pair and the known displacements between the nodes at the side node pair of said interface element having the known displacement, and, if the calculated energy release rate components cause the mixed mode fracture criterion to predict crack initiation and propagation, initiates release of the middle node pair;

(c) calculates displacements between the released middle nodes and effectively equates, by virtue of their overlapped position, the calculated displacements to the displacements of the nodes of the side node pair of a next succeeding interface element the middle node pair of which the crack front is assumed to propagate to; and (d) repeats steps (a) through (c) for the next succeeding interface element, whereby the crack is incrementally propagated over a plurality of successive interface elements in said single run of the finite element computer model.

25. The method of claim 24, wherein the model determines at least one critical interlaminar force at which the associated energy release rate components cause the mixed mode fracture criterion to predict crack initiation and propagation, and calculates the displacements between the nodes of the released node pair based on the critical interlaminar forces and the mixed mode fracture criterion.

26. The method of claim 25, wherein the displacements between the nodes of the released node pair are determined by assuming a predetermined shape for force-displacement curves and determining the force-displacement curves having said shape that pass through critical interlaminar forces at zero displacements and bounds a known area dictated by the mixed mode fracture criterion.

27. A computer readable storage medium storing computer executable instructions which when executed on a computer predicts initiation and propagation of a crack along a first direction along a potential crack plane in a structure using a finite element computer model having a non-linear solver, said computer executable instructions comprising instructions for:

defining the potential crack plane to be located at an interface between adjacent first and second layers of the structure, the interface comprising a plurality of node pairs spaced in the first direction, each node pair comprising a first node located at the first layer and a second node located at the second layer and coincident in position with said first node when there is no crack opening between said first and second layers at said node pair, the node pairs comprising a plurality of at least partially overlapping interface elements with each interface element comprising a middle bound node pair and at least two additional side node pairs spaced on opposite sides of the bound node pair, wherein the plurality of at least partially overlapping interface elements comprises a succession of said interface elements spaced along the first direction such that one side node pair of one interface element is positioned at the middle bound node pair of an adjacent interface element, establishing a crack that extends between the layers such that a front of the crack is located at the bound node pair of a respective interface element and there is a finite non-zero displacement between the nodes of one of the side node pairs of the respective interface element, wherein the nodes of the bound node pair have an input stiffness therebetween of an effectively infinite magnitude and the nodes of each side node pair, including both the side node pair having the finite non-zero displacement and another side node pair having a pair of coincident nodes, has effectively zero stiffnesses therebetween;

inputting to the finite element computer model having a non-linear solver a mixed mode fracture criterion governing initiation and propagation of the crack;

incrementally increasing an external loading on the structure using the model and, at each incremented external loading:

calculating at least one interlaminar force between the nodes of the bound node pair;

calculating associated energy release rate components at the bound node pair based on the calculating interlaminar forces between the nodes of the bound node pair and the displacements between the nodes of said side node pair having the finite non-zero displacement;

initiating release of the bound node pair if the calculated energy release rate components cause the mixed mode fracture criterion to predict crack initiating and propagation; and incrementally propagating the crack over the plurality of at least partially overlapping interface elements within a single run of the finite element computer model by repeatedly calculating at least one interlaminar force and associated energy release rate components and initiating release of the bound node pair of each successive interface element.

28. The medium of claim 27, further comprising instructions for determining at least one critical interlaminar force at which the calculated energy release rate components cause the mixed mode fracture criterion to predict crack initiation and propagation, and calculates displacements between the nodes of the released node pair based on the critical interlaminar forces and the mixed mode fracture criterion.

29. The medium of claim 27, further comprising instructions for determining the displacements between the nodes of the released node pair based upon force displacement curves of a predetermined shape that pass through the critical interlaminar forces at zero displacements and bounds a known area dictated by the mixed mode fracture criterion.

30. The medium of claim 27, wherein the interface comprises three first nodes (N1, N2, N3) spaced known distances apart along the first direction along the first layer and three second nodes (N4, N5, N6) spaced apart along the first direction along the second layer, wherein the nodes are arranged in node pairs (N1, N6), (N2, N5), and (N3, N4), wherein initially the side node pair (N1, N6) has a known nonzero displacement between nodes (N1, N6) indicating a crack has opened thereat, the nodes of middle node pair (N2, N5) are coincident and bound together, and the nodes of the side node pair (N3, N4) are coincident, and wherein said first computer-readable instructions calculate the interlaminar forces between the nodes of the middle node pair and the displacements between the nodes of the side node pair (N1, N6) based on an effectively infinite stiffness being initially defined between the nodes of the middle node pair (N2, N5) and zero stiffness being defined between the nodes of the remaining node pairs.

\* \* \* \* \*